(12) United States Patent
Conrad

(10) Patent No.: US 7,271,094 B2
(45) Date of Patent: Sep. 18, 2007

(54) MULTIPLE SHADOW MASK STRUCTURE FOR DEPOSITION SHADOW MASK PROTECTION AND METHOD OF MAKING AND USING SAME

(75) Inventor: Jeffrey W. Conrad, Verona, PA (US)

(73) Assignee: Advantech Global, Ltd, Tortola (VG)

( * ) Notice: Subject to any disclaimer, the term of this patent is extended or adjusted under 35 U.S.C. 154(b) by 237 days.

(21) Appl. No.: 10/996,142

(22) Filed: Nov. 23, 2004

(65) Prior Publication Data

US 2006/0110904 A1    May 25, 2006

(51) Int. Cl.
    *H01L 21/44*    (2006.01)
(52) U.S. Cl. ............... 438/671; 438/679; 257/E21.023; 257/E21.231
(58) Field of Classification Search .......... 438/22, 438/679, 671, 944
    See application file for complete search history.

(56) References Cited

U.S. PATENT DOCUMENTS

| | | | |
|---|---|---|---|
| 4,919,749 A | 4/1990 | Mauger et al. | |
| 5,139,610 A | 8/1992 | Dunaway et al. | |
| 5,154,797 A | 10/1992 | Blomquist et al. | |
| 6,156,217 A | 12/2000 | Hammel et al. | |
| 6,187,690 B1 | 2/2001 | Rolfson | |
| 6,696,371 B2 | 2/2004 | Butschke et al. | |
| 6,819,871 B1 * | 11/2004 | Baldwin et al. | 398/85 |
| 2003/0193285 A1 | 10/2003 | Kim | |

* cited by examiner

*Primary Examiner*—Alexander Ghyka
(74) *Attorney, Agent, or Firm*—The Webb Law Firm

(57) ABSTRACT

The present invention is a multi-layer shadow mask and method of use thereof. The multi-layer shadow mask includes a sacrificial mask bonded to a deposition mask. The sacrificial mask provides protection against an accumulation of evaporant on the deposition mask which would cause the deposition mask to deform.

8 Claims, 6 Drawing Sheets

(Prior Art)

MULTIPLE SHADOW MASK STRUCTURE FOR DEPOSITION SHADOW MASK PROTECTION AND METHOD OF MAKING AND USING SAME

BACKGROUND OF THE INVENTION

1. Field of the Invention

The present invention relates to a shadow mask for forming electronic elements on a substrate and, more particularly, to a multiple shadow mask structure for use in a vacuum deposition process.

2. Description of Related Art

Active matrix backplanes are widely used in flat panel displays for routing signals to pixels of the display in order to produce viewable pictures. Presently, such active matrix backplanes for flat panel displays are formed via a photolithography manufacturing process, which has been driven in the market by the demand for higher and higher resolution displays which are not otherwise possible with other manufacturing processes. Photolithography is a pattern definition technique which uses electromagnetic radiation, such as ultraviolet (UV) radiation, to expose a layer of resist that is deposited on the surface of a substrate. Exemplary photolithography processing steps to produce an active matrix backplane include coat photoresist, pre-bake, soak, bake, align/expose, develop, rinse, bake, deposit layer, lift off photoresist, scrub/rinse and dry. As can be seen, the active matrix backplane fabrication process includes numerous deposition and etching steps in order to define appropriate patterns of the backplane.

A vapor deposition shadow mask process has been used for years in microelectronics manufacturing. The vapor deposition shadow mask process is significantly less costly and less complex than the photolithography process. It is, therefore, beneficial to develop ways of fabricating backplanes for large-area displays by use of the more cost-effective vapor deposition shadow mask process rather than by use of the costly photolithography process.

In a shadow mask vacuum deposition process, a layer of evaporant accumulates on the shadow mask with each deposition event and, thus, with multiple runs, multiple layers of evaporant accumulate. However, as layers of evaporant accumulate on the shadow mask, the shadow mask starts to deform, i.e., curl or warp, due to the accumulation of evaporant material on the shadow mask. More specifically, the deposited evaporant material typically develops tensile stress, largely due to shrinkage from cooling, which causes the shadow mask to become compressively stressed. The composite system of the shadow mask (with its surface compressed) with one or more layers of accumulated evaporant material (with its surface tensioned) will consequently bend or warp in order to equalize the total stress. This warping undesirably enables evaporant material to undercut the shadow mask, i.e., spread between the shadow mask and the substrate at the edges of one or more apertures, which results in irregularities in the pattern that is deposited and may even cause electrical shorts. As a result, the shadow mask must be changed or cleaned regularly, e.g., $\leq 10$ deposition events, to avoid this problem. However, regular changing or cleaning is not practical in a continuous flow system because it is time consuming and costly. Moreover, cleaning tends to remove slight amounts of the mask material itself and, thus, cleaning may change the size of one or more apertures slightly. The problem is illustrated in more detail with reference to FIGS. 1, 2A and 2B.

FIG. 1 illustrates a top view of a conventional deposition mask 110, which is representative of a standard shadow mask that is suitable for use in a standard shadow mask vacuum deposition process. Conventional deposition mask 110 is formed of, without limitation, a sheet of nickel, chromium, steel or other metal. Formed within conventional deposition mask 110 is a pattern of apertures 112, which are openings of a predetermined size, shape and location, according to an associated circuit layout. During a standard shadow mask vacuum deposition process, evaporant material passes through apertures 112 for deposition upon a substrate (shown in FIGS. 2A and 2B), as is well-known. The overall dimension of conventional deposition mask 110 is user defined, and the thickness of deposition mask 110 is typically in the range of, for example, 20 to 40 microns, but may be from 10 to 100 micrometers.

Publications disclosing shadow masks and methods of forming and using shadow masks include U.S. Pat. Nos. 4,919,749; 5,139,610; 5,154,797; 6,156,217; 6,187,690; and 6,696,371, along with U.S. Patent Application Publication No. 2003/0193285.

FIG. 2A illustrates a cross-sectional view of conventional deposition mask 110, taken along line A-A of FIG. 1, in contact with a substrate 210 and prior to experiencing a deposition event. Substrate 210 is formed of, without limitation, anodized aluminum, flexible steel foil, glass or plastic. FIG. 2A shows that conventional deposition mask 110 includes a first surface 114 in intimate contact with substrate 210 and a second surface 116 which faces a deposition source (not shown) which supplies the evaporant material, such as, without limitation, metal, semiconductor, insulator or organic electroluminescent material, to be deposited via the evaporation process.

FIG. 2B illustrates a cross-sectional view of conventional deposition mask 110, taken along line A-A of FIG. 1, in contact with substrate 210 and after experiencing one or more deposition events which leaves a film or layer 212 of evaporated material on second surface 116 of conventional deposition mask 110. Second surface 116 of conventional deposition mask 110 becomes the "land area" for evaporant that does not pass through apertures 112 and, thus, layer 212 is formed thereon. Layer 212 is representative of evaporant material which has condensed and solidified on second surface 116 of conventional deposition mask 110 during one or more deposition events.

FIG. 2B illustrates the problem of conventional deposition mask 110 deforming between apertures 112 as a result of one or more deposition events. Specifically, between apertures 112, conventional deposition mask 110 curls or warps whereupon the edges of apertures 112 lift away from the surface of substrate 210. This curling or warping is caused by the difference in stress between conventional deposition mask 110 (with its surface compressed) and layer 212 (with its surface tensioned) that is deposited thereon.

As a result, the openings of apertures 112 become deformed and, thus, are no longer of the desired dimension. Furthermore, evaporant can spill into the resulting gaps between first surface 114 of conventional deposition mask 110 and substrate 210. This spillage is also known as "undercutting." Consequently, there will be undesirable irregularities in the end product because the resulting structures deposited upon substrate 210 are not of the desired geometry or dimension.

What is, therefore, needed and not disclosed in the prior art is a method for increasing the number of deposition events that a shadow mask can tolerate without warping, thereby improving the efficiency and cost-effectiveness of a continuous flow shadow mask vacuum deposition process.

SUMMARY OF THE INVENTION

The invention is a multi-layer shadow mask that includes a deposition mask having at least one aperture therethrough and a sacrificial mask having at least one aperture therethrough. The sacrificial mask and the deposition mask are coupled together with the one aperture of the sacrificial mask in alignment with the one aperture of the deposition mask. The sacrificial mask and the deposition mask are coupled in a manner whereupon adjacent the one aperture thereof the sacrificial mask is free to move away from the deposition mask to form a gap therebetween.

Adjacent the one aperture thereof, the sacrificial mask moves away from the deposition mask and forms a gap therebetween in response to the accumulation of deposited material on the sacrificial mask.

When the deposition mask and the sacrificial mask are both formed from the same material, the one aperture of the deposition mask and the one aperture of the sacrificial mask are the same size and shape. When the deposition mask and the sacrificial mask are formed from different materials, the one aperture of the deposition mask and the one aperture of the sacrificial mask have different sizes and the same shape.

The invention is also a shadow mask deposition method that includes (a) providing a deposition mask having at least one aperture therethrough; (b) providing a sacrificial mask having at least one aperture therethrough; (c) coupling the sacrificial mask and the deposition mask in contact with each other with the one aperture of the sacrificial mask in alignment with the one aperture of the deposition mask and in a manner whereupon adjacent the one aperture thereof the sacrificial mask is free to move away from the deposition mask; (d) positioning a surface of the deposition mask opposite the sacrificial mask in contact with a surface of a substrate; and (e) depositing material on the surface of the substrate exposed via the one aperture of the sacrificial mask in alignment with the one aperture of the deposition mask and on the surface of the sacrificial mask opposite the deposition mask whereupon adjacent the one aperture thereof the sacrificial mask moves away from the deposition mask and forms a gap therebetween in response to the accumulation of deposited material on the sacrificial mask.

The deposition mask adjacent the one aperture thereof desirably remains stationary relative to the substrate in response to the accumulation of deposited material on the sacrificial mask.

The method can also include repeating steps (d) and (e) a plurality of times using a different substrate each time.

The method can further include (f) removing the surface of the deposition mask opposite the sacrificial mask from contact with the surface of the substrate; (g) separating the sacrificial mask from the deposition mask; (h) providing a new sacrificial mask having at least one aperture therethrough; (i) coupling the new sacrificial mask and the deposition mask in contact with each other with the one aperture of the new sacrificial mask in alignment with the one aperture of the deposition mask and in a manner whereupon adjacent the one aperture thereof the new sacrificial mask is free to move away from the deposition mask; (j) positioning a surface of the deposition mask opposite the new sacrificial mask in contact with a surface of another substrate; and (k) depositing material on the surface of the other substrate exposed via the one aperture of the new sacrificial mask in alignment with the one aperture of the deposition mask and on the surface of the new sacrificial mask opposite the deposition mask whereupon adjacent the one aperture thereof the new sacrificial mask moves away from the deposition mask and forms a gap therebetween in response to the accumulation of deposited material thereon.

Each sacrificial mask and the deposition mask can be formed from the same material.

The deposited material can be deposited via an evaporation process. The deposited material can be a metal, a semiconductor, an insulator or an electroluminescent material.

The invention is also a multi-layer shadow mask that includes a plurality of stacked shadow masks that have been coupled together and a plurality of apertures formed through the plurality of stacked shadow masks. The stacked shadow masks are coupled together such that adjacent at least one aperture one shadow mask is free to move away from an adjacent shadow mask to form a gap therebetween.

Adjacent the one aperture thereof the one shadow mask moves away from the adjacent shadow and forms a gap therebetween in response to the deposition of material on the one shadow mask.

The shadow masks can be formed from the same material, such as, without limitation, nickel, chromium, steel, copper, Kovar® and Invar®.

Lastly, the invention is a shadow mask deposition method comprising (a) coupling a plurality of stacked shadow masks together, the stacked shadow masks defining at least one aperture therethrough; (b) positioning a surface of the stacked shadow masks in contact with a surface of a substrate; and (c) depositing material on the surface of the substrate exposed via the one aperture and on the surface of the stacked shadow masks opposite the substrate whereupon adjacent the one aperture the one shadow mask receiving the deposit of the material moves away from an adjacent shadow mask thereby forming a gap therebetween in response to the accumulation of deposited material on the one shadow mask.

Adjacent the one aperture, the adjacent shadow mask remains stationary relative to the substrate in response to the accumulation of deposited material on the one shadow mask.

The method can also include repeating steps (b) and (c) a plurality of times with a different substrate each time.

The method can further include (d) replacing the one shadow mask with a new shadow mask; (e) positioning a surface of the stacked shadow masks including the new shadow mask in contact with a surface of another substrate; and (g) depositing the material on the surface of the other substrate exposed via the one aperture and on the new shadow mask whereupon adjacent the one aperture the new shadow mask moves away from an adjacent shadow mask thereby forming a gap therebetween in response to the accumulation of deposited material on the new shadow mask.

DETAILED DESCRIPTION OF THE INVENTION

Figure 3A:
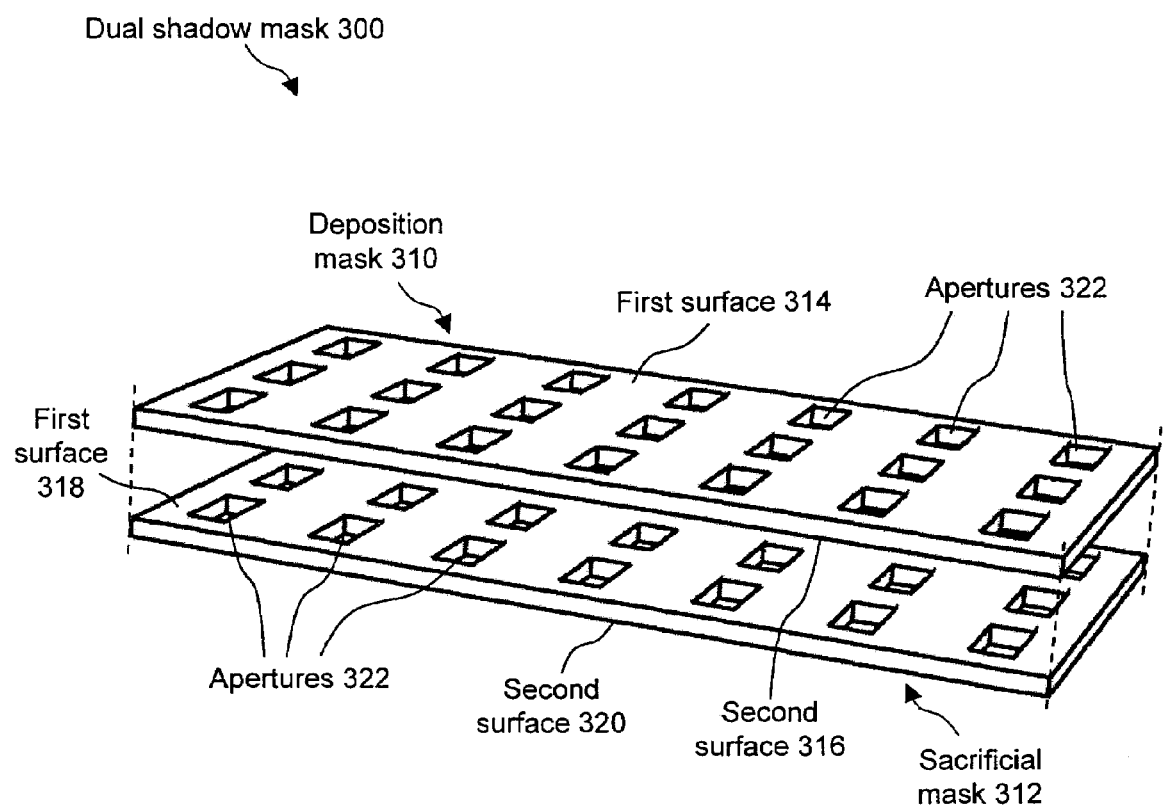
FIG. 3A is an exploded perspective view of a multi-layer shadow mask in accordance with the present invention.

With reference to FIG. 3A, a multi-layer shadow mask 300 in accordance with one embodiment of the present invention includes a deposition mask 310 and a sacrificial mask 312. Deposition mask 310 includes a first surface 314 and a second surface 316. Sacrificial mask 312 includes a first surface 318 and a second surface 320. Deposition mask 310 and sacrificial mask 312 both include an identical pattern of apertures 322.

Figure 3B:
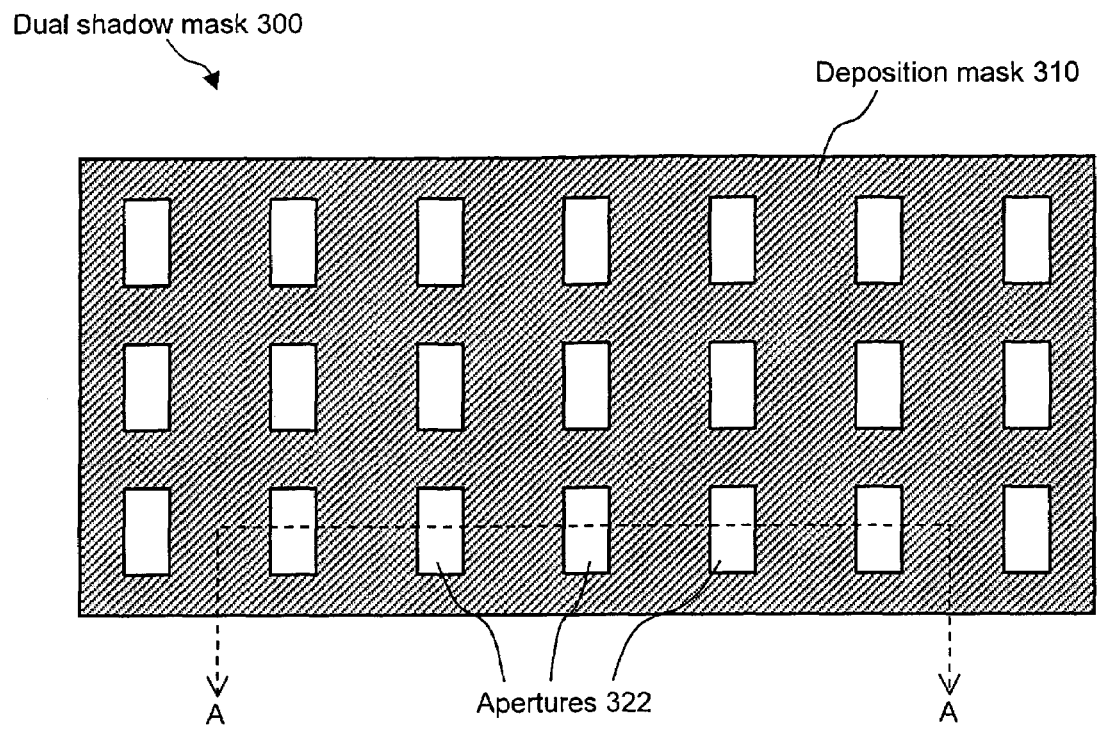
FIG. 3B is a top view of the multi-layer shadow mask of the present invention.
Figure 3C:
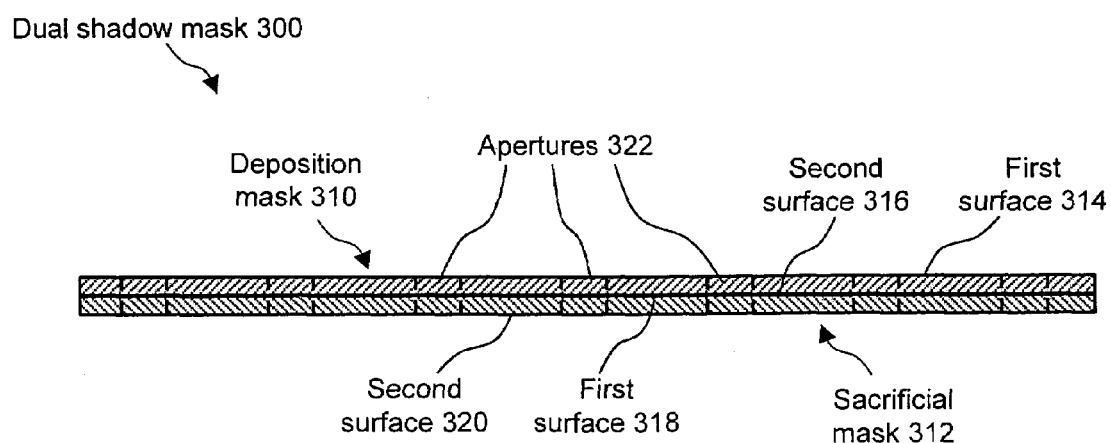
FIG. 3C is a side view of the multi-layer shadow mask of the present invention.

With reference to FIGS. 3B and 3C, and with continuing reference to FIG. 3A, deposition mask 310 and sacrificial mask 312 are oriented such that first surface 318 of sacrificial mask 312 is in contact with second surface 316 of deposition mask 310 and the pattern of apertures 322 of deposition mask 310 and sacrificial mask 312 are aligned one to another.

The multi-layer shadow mask of the present invention is not limited to a two mask structure, such as multi-layer shadow mask 300 shown in FIGS. 3A, 3B, and 3C. Alternative embodiments may include more than one sacrificial mask 312 in combination with deposition mask 310.

Deposition mask 310 and sacrificial mask 312 can each be formed of, without limitation, a sheet of nickel, chromium, steel, copper, Kovar®, Invar® or other material. Kovar® and Invar® are low coefficient of thermal expansion (CTE) materials available from, for example, ESPICorp Inc. (Ashland, Oreg.). In the United States, Kovar® is a registered Trademark, Registration No. 337,962, currently owned by CRS Holdings, Inc. of Wilmington, Del., and Invar® is a registered Trademark Registration No. 63,970, currently owned by Imphy S. A. Corporation of France.

Apertures 322 are openings of predetermined size, shape and location according to an associated circuit layout. The overall dimension of deposition mask 310 and sacrificial mask 312 is user defined. The thickness of deposition mask 310 and sacrificial mask 312 are each typically in the range of, without limitation, 20 to 40 microns, but may be in the range of 10 to 100 micrometers.

In order to match the Coefficient of Thermal Expansion (CTE) of deposition mask 310 and sacrificial mask 312, it is preferable to form them both of the same material. CTE is defined as the linear dimensional change of a material per unit change in temperature. Alternatively, deposition mask 310 and sacrificial mask 312 can be formed of different materials having different CTE values. However, the dimension of apertures 322 of deposition mask 310 vs. the dimension of apertures 322 of sacrificial mask 312 may have to differ slightly in order to compensate for the different CTE values.

Figure 4A:
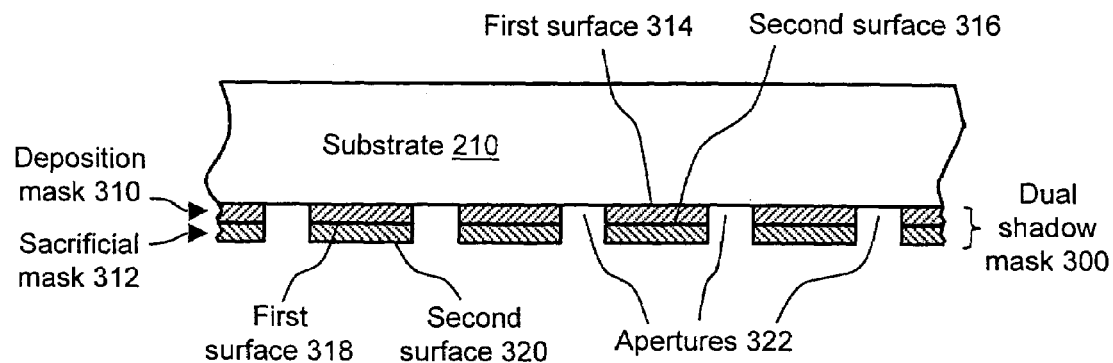
FIG. 4A is a cross-sectional view of the multi-layer shadow mask of the present invention, taken along line A-A in FIG. 3B and prior to experiencing a deposition event.

With reference to FIG. 4A, prior to a first deposition event, first surface 314 of deposition mask 310 is positioned in intimate contact with substrate 210, first surface 318 of sacrificial mask 312 is positioned in intimate contact with second surface 316 of deposition mask 310, and second surface 320 of sacrificial mask 312 is oriented facing a deposition source (not shown) which supplies the material, such as metal, semiconductor, insulator or organic electroluminescent material, to be deposited via an evaporation process.

Figure 4B:
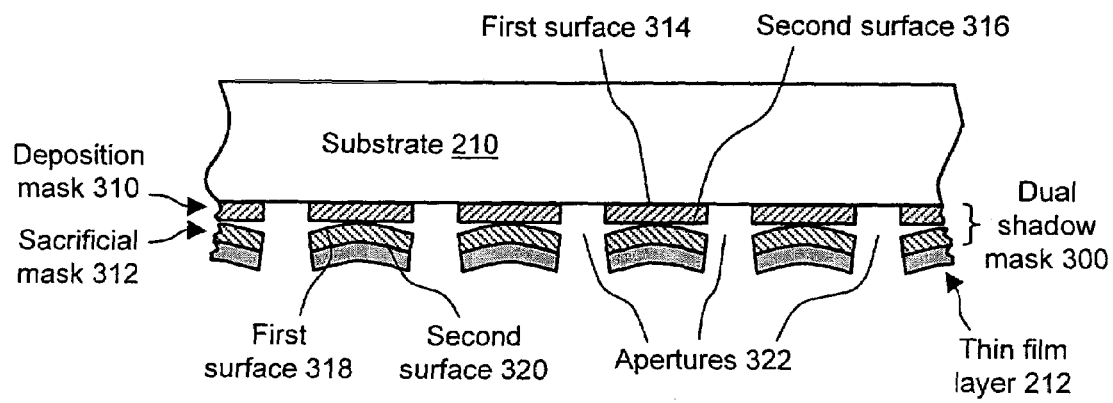
FIG. 4B is a cross-sectional view of the multi-layer shadow mask of the present invention, taken along line A-A in FIG. 3B and after experiencing one or more deposition events.

With reference to FIG. 4B, in response to multi-layer shadow mask 300 and substrate 210 experiencing one or more deposition events, layer 212 (described in connection with FIG. 2B) forms on second surface 320 of sacrificial mask 312. Second surface 320 of sacrificial mask 312 becomes the land area for evaporant material that does not pass through apertures 322 whereupon layer 212 forms thereon by condensing and solidifying during one or more deposition events.

FIG. 4B illustrates how sacrificial mask 312 between apertures 322 deforms as a result of one or more deposition events while, at the same time, deposition mask 310 between apertures 322 is not deformed. Specifically, sacrificial mask 312 between or adjacent apertures 322 curls or warps away from second surface 316 of deposition mask 310 whereupon the edges of apertures 322 of only sacrificial mask 312 lift away from second surface 316 of deposition mask 310. The material of sacrificial mask 312 between apertures 322 curls because of the difference in stress between sacrificial mask 312 (with its surface compressed) and layer 212 (with its surface tensioned) that is deposited thereon. However, the intimate contact of first surface 314 of deposition mask 310 against substrate 210 is maintained even though evaporant material may spill into the gap between first surface 318 of sacrificial mask 312 and second surface 316 of deposition mask 310. Even though evaporant material fills this gap, it does not have a curling effect on deposition mask 310 because there is no continuous run of second surface 316 of deposition mask 310 between apertures 322 for evaporant material to accumulate upon. As a result, first surface 314 of deposition mask 310 remains in intimate contact with substrate 210. Consequently, the geometry and dimensions of apertures 322 of deposition mask 310 remain unchanged because deposition mask 310 is shielded by sacrificial mask 312 from the negative effects of layer 212.

Figure 5:
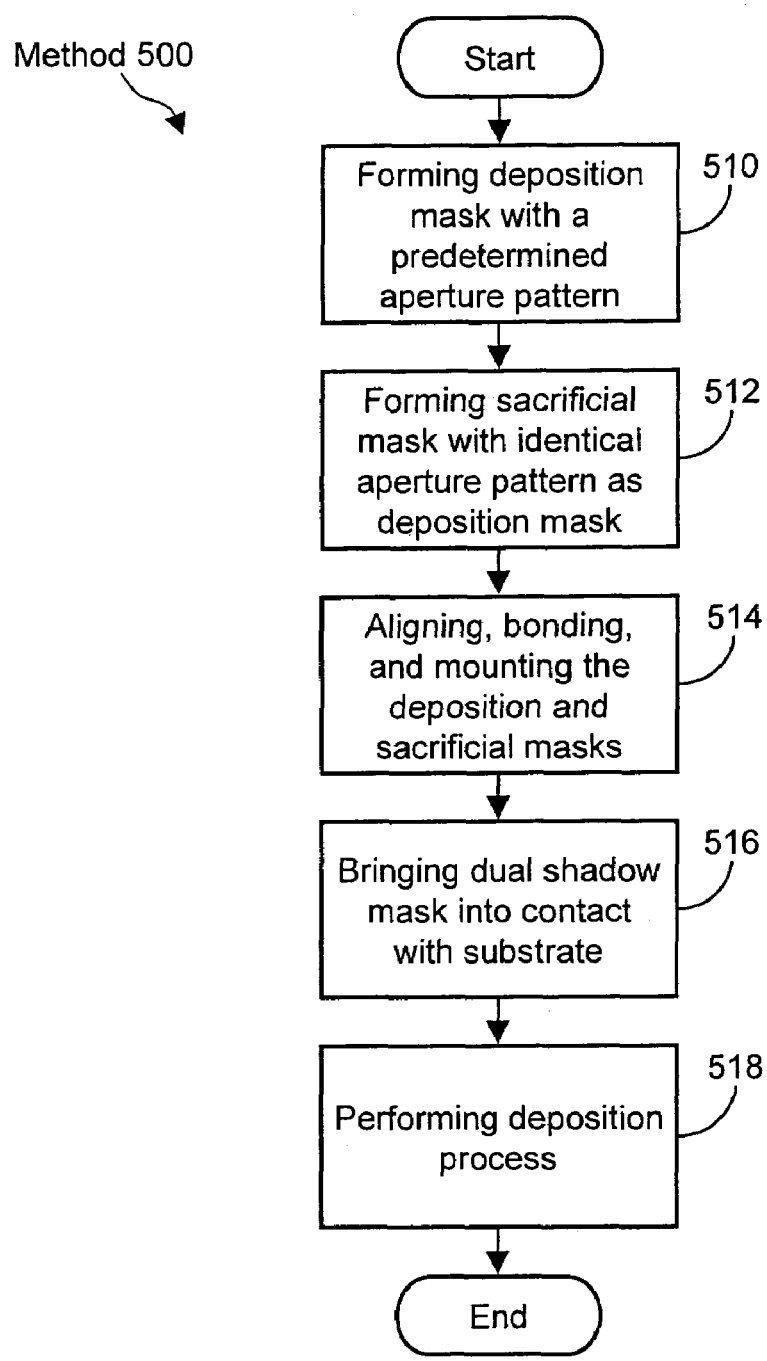
FIG. 5 is a flow diagram of a method of making and using the multi-layer shadow mask of the present invention in a standard shadow mask vacuum deposition process.

With reference to FIG. 5, a flow diagram of a method 500 of making and using multi-layer shadow mask 300 of the present invention in a standard shadow mask vacuum deposition process includes step 510, wherein deposition mask 310 of multi-layer shadow mask 300 is formed of, without limitation, nickel, chromium, steel, copper, Kovar®, Invar®, or other suitable metal to any user-defined dimension and with any user-defined pattern of apertures 322.

The method then advances to step 512, wherein sacrificial mask 312 of multi-layer shadow mask 300 is formed of, without limitation, nickel, chromium, steel, copper, Kovar®, Invar® or other suitable metal to the same user-defined dimension as deposition mask 310 in step 510 and with the same user-defined pattern of apertures 322 as deposition mask 310 in step 510.

The method then advances to step 514, wherein second surface 316 of deposition mask 310 and first surface 318 of sacrificial mask 312 are mechanically or optically aligned and bonded together using, without limitation, an adhesive, around their perimeters. Alternatively, deposition mask 310 and sacrificial mask 312 are aligned and stitched together ultrasonically.

The method then advances to step 516, wherein first surface 314 of deposition mask 310 is brought into intimate contact with substrate 210 and secured via any conventional technique.

Lastly, the method advances to step 518, wherein a deposition process is performed, such as the deposition process described in U.S. Patent Application Publication No. 2003/0228715, entitled "Active-matrix backplane for controlling controlled elements and method of manufacture thereof", which is incorporated herein by reference. The '715 patent application describes an electronic device formed from electronic elements deposited on a substrate. The electronic elements are deposited on the substrate by the advancement of the substrate through a plurality of deposition vacuum vessels that have at least one material deposition source and a shadow mask positioned therein. The material from at least one material deposition source positioned in each deposition vacuum vessel is deposited on the substrate through the shadow mask that is positioned in the deposition vacuum vessel, in order to form on the substrate a circuit formed of an array of electronic elements. The circuit is formed solely by the successive deposition of materials on the substrate.

Figure 1:
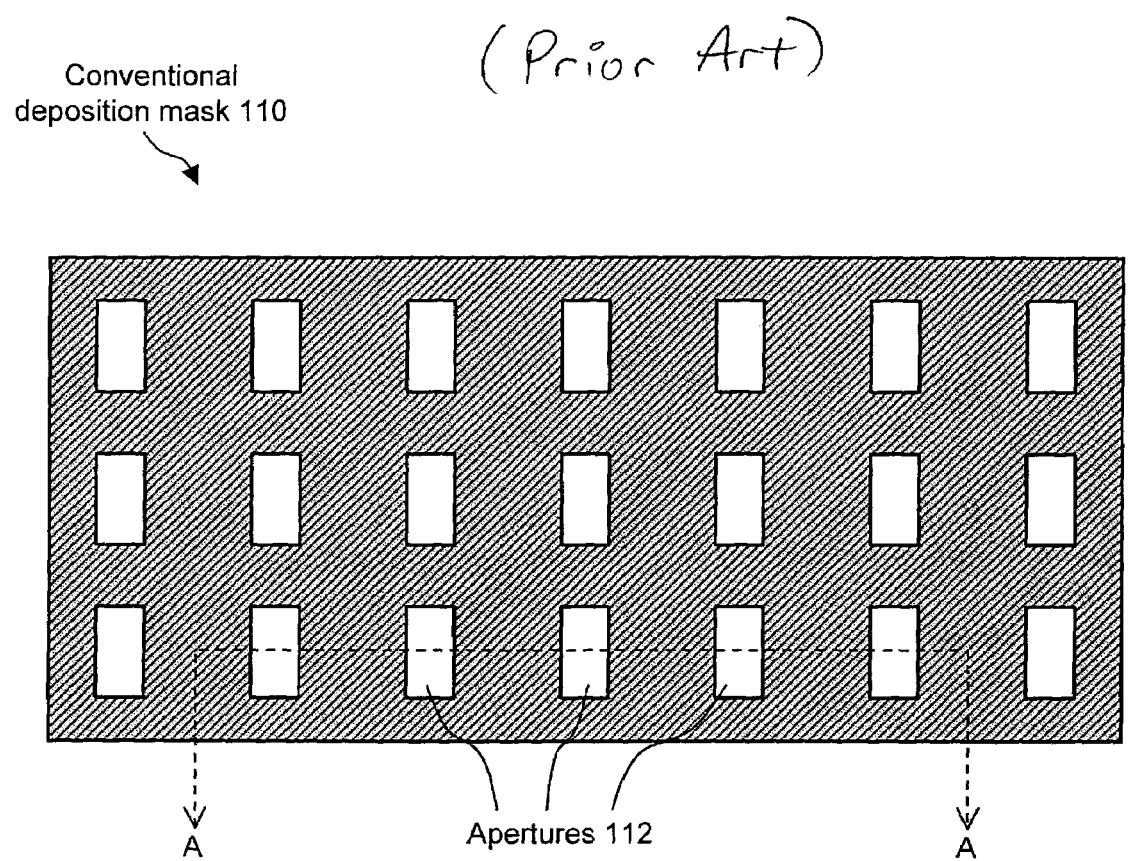
FIG. 1 is a top view of a prior art shadow mask that is suitable for use in a conventional shadow mask vacuum deposition process.
Figure 2A:
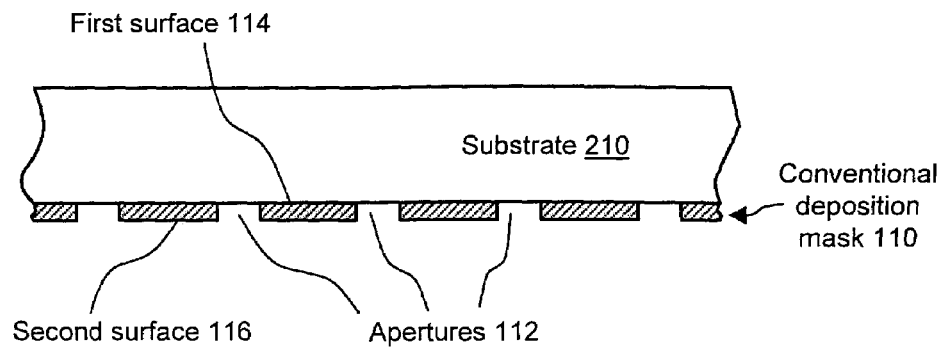
FIG. 2A is a cross-sectional view of the prior art shadow mask, taken along line A-A in FIG. 1, in contact with a substrate and prior to experiencing a deposition event.
Figure 2B:
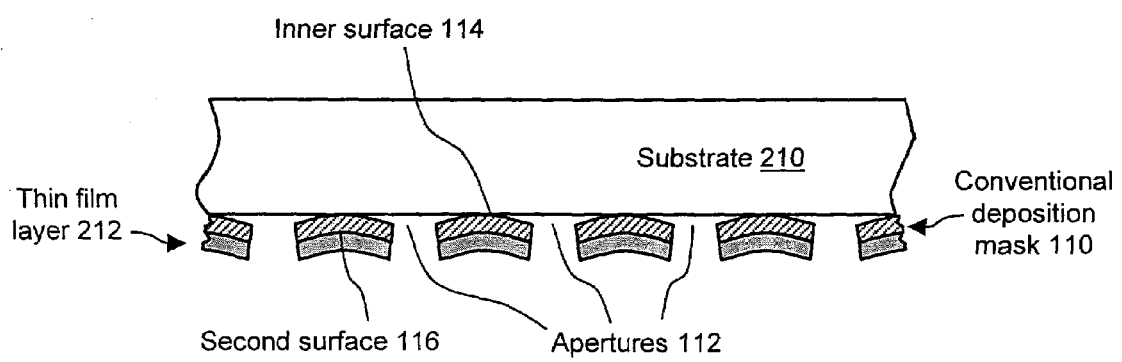
FIG. 2B is a cross-sectional view of the prior art shadow mask, taken along line A-A in FIG. 1, in contact with a substrate and after experiencing one or more deposition events.

In summary, multi-layer shadow mask 300 of the present invention is particularly well suited for use in a continuous flow shadow mask vacuum deposition process, because multi-layer shadow mask 300 is able to withstand an increased number of deposition events without deforming, as compared to a standard shadow mask, such as conventional deposition mask 110 of FIGS. 1, 2A and 2B. More particularly, sacrificial mask 312 shields deposition mask 310 from an accumulation of evaporant, such as layer 212, and, therefore, prevents deposition mask 310 between apertures 322 from deforming because of the material stresses of evaporant material cooling and solidifying on deposition mask 310. As a result, multi-layer shadow mask 300 of the present invention has an increased lifetime in a continuous flow shadow mask vacuum deposition system while, at the same time, manufacturing irregularities are avoided by the use of multi-layer shadow mask 300.

If desired, after a number of deposition events, multi-layer shadow mask 300, including layer 212 on second surface 320 of sacrificial mask 312 can be removed from a deposition vacuum vessel after the thickness of layer 212 has built up sufficiently to negatively affect future deposition events. Once multi-layer shadow mask 300 is removed from the deposition vacuum vessel, sacrificial mask 312, including layer 212 thereon, can be separated from deposition mask 310. Thereafter, a new sacrificial mask absent layer 212 can be joined to the original deposition mask 310 in the manner described above in connection with sacrificial mask 312 to form a new multi-layer shadow mask 300. Thereafter, first surface 314 of deposition mask 310 of new mutli-layer shadow mask 300 can be brought into intimate contact with substrate 210 and secured via any conventional technique for subsequent deposition events. Thus, a single deposition mask 310 can be utilized with a plurality of different sacrificial masks 312.

The present invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A shadow mask deposition method comprising:
   (a) providing a deposition mask having at least one aperture therethrough;
   (b) providing a sacrificial mask having at least one aperture therethrough;
   (c) coupling the sacrificial mask and the deposition mask in contact with each other with the one aperture of the sacrificial mask in alignment with the one aperture of the deposition mask and in a manner whereupon adjacent the one aperture thereof the sacrificial mask is free to move away from the deposition mask;
   (d) positioning a surface of the deposition mask opposite the sacrificial mask in contact with a surface of a substrate; and
   (e) depositing material on the surface of the substrate exposed via the one aperture of the sacrificial mask in alignment with the one aperture of the deposition mask and on the surface of the sacrificial mask opposite the deposition mask wherein:
      adjacent the one aperture thereof the sacrificial mask moves away from the deposition mask and forms a gap therebetween in response to the accumulation of deposited material on the sacrificial mask; and
      adjacent the one aperture thereof the deposition mask remains stationary relative to the substrate in response to the accumulation of deposited material on the sacrificial mask.

2. The method of claim 1, further including repeating steps (d) and (e) a plurality of times using a different substrate each time.

3. The method of claim 2, further including:
   (f) removing the surface of the deposition mask opposite the sacrificial mask from contact with the surface of the substrate;
   (g) separating the sacrificial mask from the deposition mask;
   (h) providing a new sacrificial mask having at least one aperture therethrough;
   (i) coupling the new sacrificial mask and the deposition mask in contact with each other with the one aperture of the new sacrificial mask in alignment with the one aperture of the deposition mask and in a manner whereupon adjacent the one aperture thereof the new sacrificial mask is free to move away from the deposition mask;
   (j) positioning a surface of the deposition mask opposite the new sacrificial mask in contact with a surface of another sustrate; and
   (k) depositing material on the surface of the other substrate exposed via the one aperture of the new sacrificial mask in alignment with the one aperture of the deposition mask and on the surface of the new sacrificial mask opposite the deposition mask whereupon adjacent the one aperture thereof the new sacrificial mask moves away from the deposition mask and forms a gap therebetween.

4. The method of claim 1, wherein the sacrificial mask and the deposition mask are formed from the same material.

5. The method of claim 1, wherein:
   the deposited material is deposited via an evaporation process; and
   the deposited material is one of a metal, a semiconductor, an insulator and an electroluminescent material.

6. A shadow mask deposition method comprising:
   (a) coupling a plurality of stacked shadow masks together, the stacked shadow masks defining at least one aperture therethrough;
   (b) positioning a surface of the stacked shadow masks in contact with a surface of a substrate; and
   (c) depositing material on the surface of the substrate exposed via the one aperture and on the surface of the stacked shadow masks opposite the substrate, wherein:
      adjacent the one aperture one shadow mask receiving the deposit of the material moves away from an adjacent shadow mask thereby forming a gap therebetween in response to the accumulation of deposited material on the one shadow mask; and
      adjacent the one aperture the adjacent shadow mask remains stationary relative to the substrate.

7. The method of claim 6, further including repeating steps (b) and (c) a plurality of times with a different substrate each time.

8. The method of claim 6, further including:
(d) replacing the one shadow mask with a new shadow mask;
(e) positioning a surface of the stacked shadow masks including the new shadow mask in contact with a surface of another substrate; and
(f) depositing the material on the surface of the other substrate exposed via the one aperture and on the new shadow mask whereupon adjacent the one aperture the new shadow mask moves away from an adjacent shadow mask thereby forming a gap therebetween in response to the accumulation of deposited material on the new shadow mask.

* * * * *